(12) United States Patent
England et al.

(10) Patent No.: US 8,937,019 B2
(45) Date of Patent: Jan. 20, 2015

(54) TECHNIQUES FOR GENERATING THREE DIMENSIONAL STRUCTURES

(71) Applicant: Varian Semiconductor Equipment Associates, Inc., Gloucester, MA (US)

(72) Inventors: Jonathan G. England, Horsham (GB); Patrick M. Martin, Ipswich, MA (US); David Cox, Guildford (GB)

(73) Assignee: Varian Semiconductor Equipment Associates, Inc., Gloucester, MA (US)

( * ) Notice: Subject to any disclaimer, the term of this patent is extended or adjusted under 35 U.S.C. 154(b) by 0 days.

(21) Appl. No.: 13/855,173

(22) Filed: Apr. 2, 2013

(65) Prior Publication Data

US 2013/0284697 A1 Oct. 31, 2013

Related U.S. Application Data

(60) Provisional application No. 61/619,710, filed on Apr. 3, 2012.

(51) Int. Cl.
- *H01L 21/302* (2006.01)
- *H01L 21/461* (2006.01)
- *B44C 1/22* (2006.01)
- *G03F 7/00* (2006.01)
- *G03F 7/20* (2006.01)

(52) U.S. Cl.
CPC .............. *B44C 1/227* (2013.01); *G03F 7/0002* (2013.01); *G03F 7/2016* (2013.01)
USPC ............................ 438/706; 438/713; 438/719

(58) Field of Classification Search
CPC ......... G03F 1/80; G03F 7/004; G03F 7/0041; H01L 21/31144; H01L 21/0274; H01L 21/308
See application file for complete search history.

(56) References Cited

U.S. PATENT DOCUMENTS

| | | | | |
|---|---|---|---|---|
| 6,986,972 | B1 * | 1/2006 | Rissman | 430/5 |
| 2003/0146485 | A1 * | 8/2003 | Ezaki | 257/499 |
| 2008/0261384 | A1 | 10/2008 | Zhi-Qiang et al. | |
| 2010/0316941 | A1 * | 12/2010 | Sasaki | 430/5 |
| 2011/0020960 | A1 | 1/2011 | Henry et al. | |

(Continued)

FOREIGN PATENT DOCUMENTS

| | | |
|---|---|---|
| EP | 2144117 A1 | 1/2010 |
| WO | 2012140210 A | 10/2012 |

OTHER PUBLICATIONS

Chekurov, N., et al, The Fabrication of Silicon Nanostructures by Local Gallium Implantation and Cryogenic Deep Reactive Ion Etching, Nanotechnology, 2009, pp. 1-5, vol. 20, IOP Publishing.

(Continued)

*Primary Examiner* — Duy Deo

(57) ABSTRACT

Techniques for forming a three dimensional (3D) feature on a substrate are disclosed. In one exemplary embodiment, the technique may be realized as a method comprising: forming a resist structure on the substrate, the resist structure having a first resist portion with a first thickness, a second resist portion with a second thickness, and a third resist portion with a third thickness, where the first thickness may be less than the second thickness, and where the second thickness may be less than the third thickness; implanting charged particles into the substrate through the first and second resist portions and forming an implanted region in the substrate; and etching the substrate to form the 3D feature on the substrate.

20 Claims, 4 Drawing Sheets

(56) References Cited

U.S. PATENT DOCUMENTS

2011/0223546 A1 9/2011 Godet et al.
2012/0067718 A1 3/2012 Cox

OTHER PUBLICATIONS

Grime, G.W., Materials Patterning and Characterisation at the Nanometre Scale Using Focused MeV Ion Beams: Present Achievements and Future Prospects, Acta Physica Polonica A, 2009, pp. 467-472, vol. 115.

Chen, Yang, et al., Fabrication of Precision 3D Microstructures by Use of a Combination of Ultraprecision Diamond Turning and Reactive Ion Etching Process, Journal of Micromechanics and Microengineering, 2007. pp. 883-890, vol. 17, IOP Publishing.

International Search Report and Written Opinion, with a mailing dated of Jul. 16, 2013 for PCT /US2013/035068, filed Apr. 3, 2013.

* cited by examiner

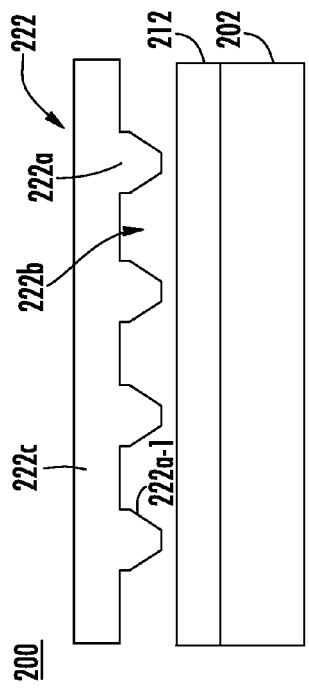
FIG. 2A
FIG. 2C
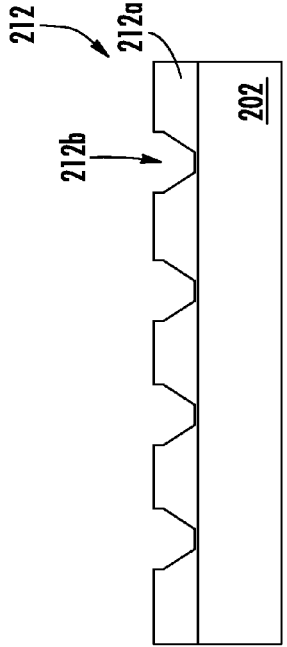
FIG. 2B
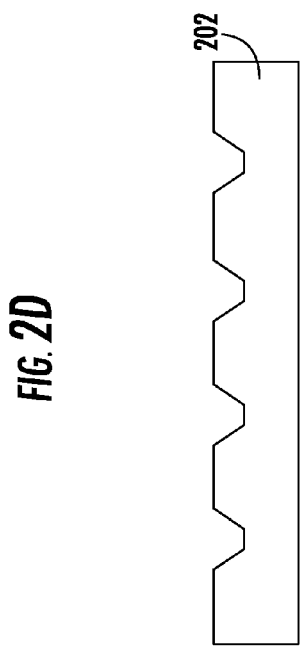
FIG. 2D
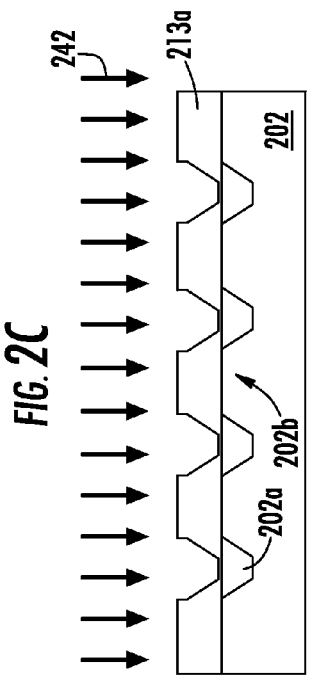
FIG. 2E
FIG. 2F

US 8,937,019 B2

TECHNIQUES FOR GENERATING THREE DIMENSIONAL STRUCTURES

PRIORITY

This application is a Non-Provisional application of and claims priority to U.S. Provisional Application Ser. No. 61/619,710, filed on Apr. 3, 2012, and entitled "Techniques For Generating Three Dimensional Structures." The U.S. Provisional Application Ser. No. 61/619,710 is incorporated in its entirety by reference.

FIELD

Present disclosure relates to techniques for processing a substrate, more particularly to techniques generating structures with inclined edge.

BACKGROUND

In the field of manufacturing devices, lithography is often used. The process is a pattern transferring process that is used to generate features of desired shape and size. The process begins with coating a layer of resist on a substrate. Thereafter, a mask having desired pattern is disposed upstream of the resist. A radiation source is disposed upstream of the mask, and the radiation from the radiation source is directed toward the resist through the mask. The mask comprises one or more transparent areas through which the radiation may pass, and one or more opaque areas that block the radiation. The portion of the resist exposed to the radiation is cured and hardened, whereas the portion not exposed to the radiation remains uncured. The uncured portion is then removed exposing a portion of the substrate thereunder. As a result, the pattern of the mask is transferred onto the resist.

The pattern is then transferred to the substrate using wet or dry etching process. For example, the exposed portion of the substrate is etched with etchant, whereas the portion of the substrate covered with the resist structure may remain unetched. As a result, the pattern of the resist structures may be transferred onto the substrate.

This pattern transferring process is an important process in manufacturing semiconductor devices with high circuit density. By manipulating the radiation, the mask, and the resist, a substrate with sub-micron patterns may be generated. However, this process requires complex and costly optical systems for precise manipulation of the radiation. With the wavelength of the radiation used in device manufacturing continually decreasing, manipulation of such radiation has become more costly and difficult.

In response, less complex and less costly nano-imprint lithography has been developed. In this lithography process, a substrate 102 is coated with resist 112, as shown in FIG. 1A. Thereafter, a mold 122 (FIG. 1B) having a desired pattern may be pressed against the substrate 102 (FIG. 1C). The mold 122 may comprise a base 122a and a plurality of protrusions 122b that are spaced apart by recess 122c. While the mold 122 is pressed against the substrate 102, the resist 112 is exposed to the radiation 132 and cured (FIG. 1C). By curing the resist 112 while the mold is pressed, a pattern reflective of that in the mold 122 may be formed on the resist 112 (FIG. 1D). The mold 122 is subsequently removed, and the resulting substrate 102 may be etched according to the pattern of the resist 112 (FIG. 1E). Thereafter, the resist structure 112a remaining on the substrate 102 may be removed (FIG. 1F).

Although the nano-imprint lithography may be a cost effective process, the shape of the image or pattern that can be formed in the substrate using the process is limited. As such, a new process for forming structures is needed.

SUMMARY

Techniques for forming a three dimensional (3D) feature on a substrate are disclosed. In one exemplary embodiment, the technique may be realized as a method comprising: forming a resist structure on the substrate, the resist structure having a first resist portion with a first thickness, a second resist portion with a second thickness, and a third resist portion with a third thickness, where the first thickness may be less than the second thickness, and where the second thickness may be less than the third thickness; implanting charged particles into the substrate through the first and second resist portions and forming an implanted region in the substrate; and etching the substrate to form the 3D feature on the substrate.

In accordance with other aspects of this particular exemplary embodiment, the implanted region may comprise a first implanted region portion and a second implanted region portion.

In accordance with further aspects of this particular exemplary embodiment, the second implanted region portion may have greater implant depth than the first implanted region portion.

In accordance with further aspects of this particular exemplary embodiment, the method may further comprise reducing etch resistance of the implanted region such that the implanted region of the substrate has higher etch rate than a region outside the implanted region.

In accordance with additional aspects of this particular exemplary embodiment, the method may further comprise annealing the substrate prior to the etching the substrate.

In accordance with other aspects of this particular exemplary embodiment, the method may further comprise: increasing etch resistance of the implanted region such than the implanted region of the substrate has higher etch resistance than a region outside the implanted region.

In accordance with additional aspects of this particular exemplary embodiment, the charged particles may comprises at least on of hydrogen (H), helium (He), boron (B), carbon (N), silicon (Si), nitrogen (N), oxygen (O), and fluorine (F) species.

In accordance with further aspects of this particular exemplary embodiment, the 3D feature on the substrate has an edge that is inclined relative to general plane of the substrate.

In accordance with other aspects of this particular exemplary embodiment, the etching may comprise performing an isotropic etching.

In accordance with additional aspects of this particular exemplary embodiment, the forming the resist structure on the substrate may comprises coating a resist layer onto the substrate; pressing a mold against the resist layer, the mold having at least one protrusion; curing the resist layer while the mold is pressed against the resist layer; and removing the mold from the substrate.

In accordance with further aspects of this particular exemplary embodiment, the implanting charged particles may comprise implanting the charged particles into the substrate through the first and second resist portions without implanting the charged particles into the substrate through the third resist portion.

In another exemplary embodiment, the technique may be realized as a method comprising: forming a resist structure on the substrate, where the resist structure may have a first resist region and a second resist region, where the first resist region may have a resist edge that is inclined relative to general plane of the substrate; implanting charged particles into the substrate through the first resist region and forming an implanted region in the substrate, where the implanted region may have an implanted region edge that is inclined relative to the general plane of the substrate; and etching the substrate to form the 3D feature on the substrate.

In accordance with other aspects of this particular exemplary embodiment, the 3D feature may have a feature edge that is inclined relative to general plane of the substrate.

In accordance with further aspects of this particular exemplary embodiment, the implanting charged particles into the substrate may comprise implanting the charged particles into the substrate through the first resist region without implanting the charged particles into the substrate through the second resist region.

In accordance with additional aspects of this particular exemplary embodiment, the method may further comprise reducing etch resistance of the implanted region such that the implanted region of the substrate has higher etch rate than a region outside the implanted region.

In accordance with other aspects of this particular exemplary embodiment, the method may further comprise increasing etch resistance of the implanted region such that the implanted region of the substrate has lower etch rate than a region outside the implanted region.

In accordance with further aspects of this particular exemplary embodiment, the charged particles may comprise at least on of hydrogen (H), helium (He), boron (B), carbon (N), silicon (Si), nitrogen (N), oxygen (O), and fluorine (F) species.

In accordance with additional aspects of this particular exemplary embodiment, the etching the substrate may comprise performing an isotropic etching.

In accordance with other aspects of this particular exemplary embodiment, the forming the resist structure on the substrate may be performed with nano-imprint lithography process.

In another exemplary embodiment, the technique may be realized as a method for forming a three dimensional (3D) feature on a substrate, the method comprising: forming a resist structure on the substrate, the resist structure having a first resist portion with a first thickness, a second resist portion with a second thickness, wherein the first thickness is less than the second thickness; implanting charged particles into the substrate through the first resist portion without implanting the charged particles into the substrate through the second resist portion; and etching the substrate to form the 3D feature on the substrate.

The present disclosure will now be described in more detail with reference to exemplary embodiments thereof as shown in the accompanying drawings. While the present disclosure is described below with reference to exemplary embodiments, it should be understood that the present disclosure is not limited thereto. Those of ordinary skill in the art having access to the teachings herein will recognize additional implementations, modifications, and embodiments, as well as other fields of use, which are within the scope of the present disclosure as described herein, and with respect to which the present disclosure may be of significant utility.

BRIEF DESCRIPTION OF THE DRAWINGS

In order to facilitate a fuller understanding of the present disclosure, reference is now made to the accompanying drawings, in which like elements are referenced with like numerals. These drawings should not be construed as limiting the present disclosure, but are intended to be exemplary only.

FIG. 2A-2F illustrate an exemplary method for forming a three dimensional (3D) feature on a substrate according to one embodiment of the present disclosure.

DETAIL DESCRIPTION

Figure 1A:
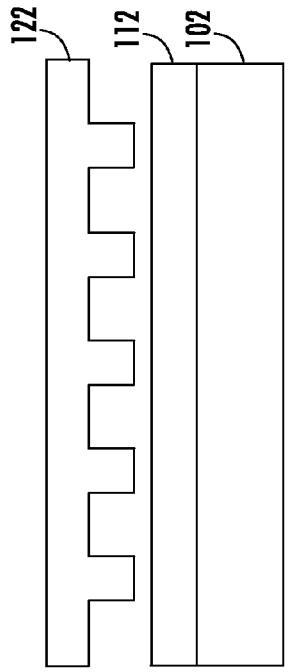
FIG. 1A-1F illustrate conventional nano-imprint lithography process.
Figure 1C:
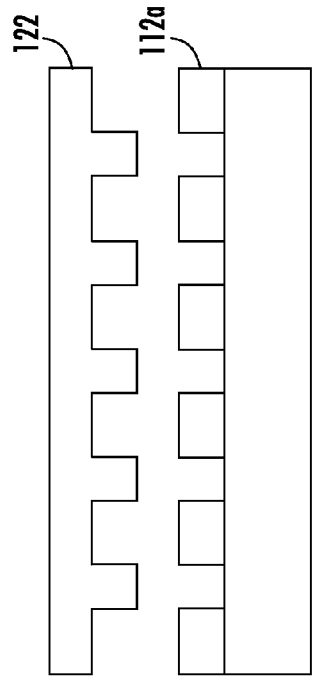
Figure 1E:
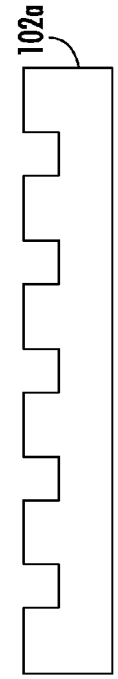
Figure 1B:
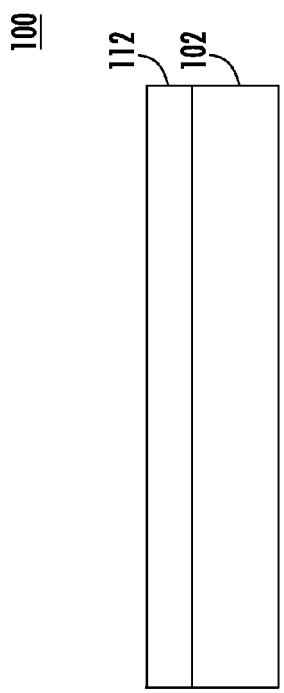
Figure 1D:
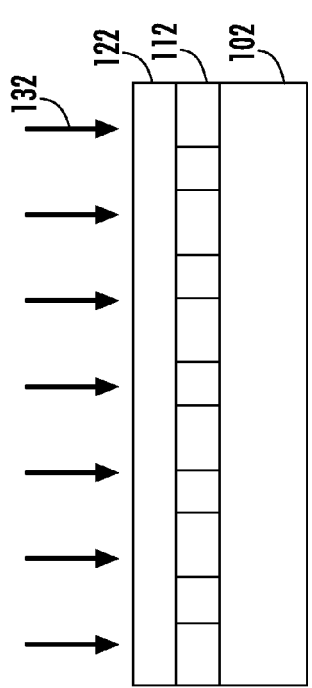
Figure 1F:
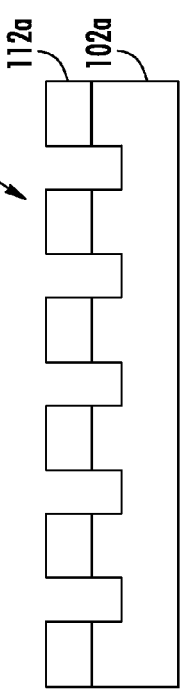

To solve the aforementioned problems associated with conventional patterning process, the present disclosure introduces a new patterning process for generating 3D features on a substrate. For purpose of clarity, several embodiments of the disclosed method are introduced in context of particles introduced into a substrate. The particles may be charged or neutral, sub-atomic, atomic, or molecular particles. If introduced as charged particles, the charged particles may be ions introduced into the substrate via ion implantation process.

In addition, for purpose of clarity and simplicity, the present disclosure may focus on techniques for generating one or more features with an inclined. The inclined or angled edge may be an edge that is in angled relative to the general plane of the object in which the feature is disposed. In addition, the inclined edge may be neither parallel nor perpendicular to the general plane of the object. If a feature formed on the substrate has an inclined edge, the edge may be angled to the general plane of the substrate. In addition, the edge may also be neither perpendicular nor parallel relative to the general plane of the substrate.

Although the present disclosure focuses on forming 3D features with an inclined edge, those of ordinary skill in the art will recognize that the present disclosure may be just as applicable for generating one or more features with an edge that is either perpendicular or parallel to the general plane of the substrate. Moreover, the present disclosure may not be limited to straight edge, but just as applicable to a curved edge.

Referring to FIG. 2A-2F, there are shown an exemplary technique for generating a three dimensional (3D) feature on a substrate according to one embodiment of the present disclosure. As illustrated in FIG. 2A, a substrate 202 may be coated with resist to form a resist layer 112. In some embodiment, the resist layer 212 may be directly coated on the substrate 202. In other embodiments, the resist layer 212 may be coated onto one or more intermediate layers (not shown) disposed on the substrate 202. Thereafter, a mold 222 having a desired pattern (FIG. 2B) may be pressed against the resist layer 212 (FIG. 2C). In the present embodiment, the mold 222 is pressed against the resist layer 212 with sufficient force such that mold 222 is in contact with the substrate 202. However, those of ordinary skill in the art will recognize that the mold 222 in other embodiments may be spaced apart and does not contact the substrate 202.

As illustrated in FIG. 2B, the mold 222 may have a desired pattern. In the present embodiment, the mold 222 may comprise one or more mold protrusions 222a. If two or more mold protrusions 222a are present, each of the mold protrusions 222a may be spaced apart from one another by one or more mold recess 222a. In the present embodiment, the protrusion edge 222a-1 may have an edge that is inclined, as illustrated in FIG. 2B. For example, the protrusion 222a may be shaped as a four sided pyramid with four inclined protrusion edges 222a-1. However, the present disclosure does not preclude the protrusion with other shapes and/or protrusion with different number of inclined protrusion edge.

While the mold 222 is pressed against the resist layer 212 (FIG. 2C), the resist layer 212 is cured. To cure the resist layer 212, the resist layer 212 may be exposed to the radiation 232 from a radiation source (not shown) positioned upstream of the mold 222. In another embodiment, the resist layer 212 is cured and hardened as the resist layer 212 is exposed to heat from a heat source (not shown) near the resist layer 212. In some embodiments, the mold 222 may be transparent to one or more desired wavelengths while opaque to wavelength other than desired wavelengths.

After the resist layer 212 is cured, the mold 222 may be removed. As shown in FIG. 2D, the resulting resist layer 212 may have one or more resist structures 212a corresponding to one or more mold recess 222b. Adjacent to the resist structure 212a, there may be one or more gaps 212 corresponding to one or more mold protrusion 222a. The gap 212b in the present embodiment may have an inverse pyramid shape resulting from the inverse pyramid shaped mold protrusion 222a. Meanwhile, the resist structure 212 may have a pyramid shape resulting from the pyramid shaped mold recess 222b. As illustrated in FIG. 2D, the resist structure 212a may have a resist structure edge 212a-1 that may be inclined or angled with respect to the general plane of the resist layer 212 and/or the substrate 202.

Figure 3:
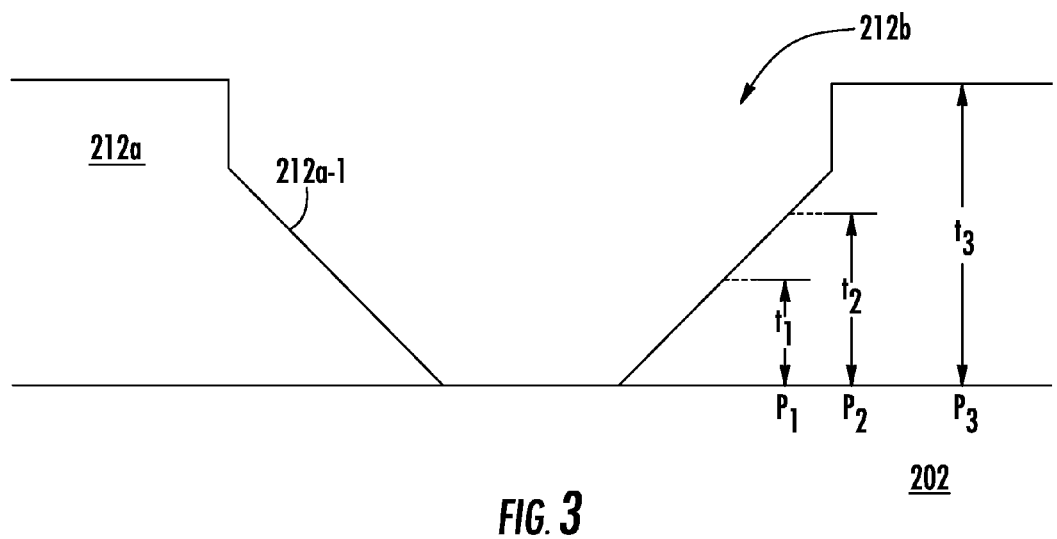
FIG. 3 illustrate a detailed illustration of a resist stricter shown in FIG. 2A-2E.

The resist structure 212a may also have varying thickness. As illustrate in FIG. 3, the resist structure 212a may have a first thickness $t_1$ at a first point $P_1$ and a second thickness $t_2$ greater than the first thickness $t_1$ at a second point $P_2$. Further, the resist structure 212a may have a third thickness $t_3$ at a third point $P_3$.

After the mold 222 is removed, the resist layer 212 may be exposed to particles 242 of desired species, as shown in FIG. 2E. In the present embodiment, the particles 242 are directed toward the resist layer 212 with sufficient energy to pass through one or more predetermined regions of the resist layer 212. For example, the particles 242 may be directed at sufficient energy and the thickness of the resist structure may be such that the particles 242 may pass through the first and second points $P_1$ and $P_2$ of the resist structure edge 212a-1 (e.g. the portion of the resist structure 212a having an inclined resist structure edge 212a-1). However, the particles 242 may not pass through the third point $P_3$ of the resist structure 212a. In the present embodiment, the energy of the particles 242 may preferably be constant. However, directing the particles 242 at varying energy is not precluded in the present disclosure. Moreover, the temperature of the substrate 202 may be maintained at constant temperature, or the temperature may vary during the implantation process. The temperature of the substrate may range between about −100° C. to about 750° C.

In the present embodiment, implanting the particles 242 through the resist structure 212b may result in formation of implanted region with varying implant depth 202a. For example, the particles 242 implanted through a portion of the resist structure 212a with less thickness (e.g. $P_1$) may be implanted at greater depth. Meanwhile, the particles 242 implanted through another portion of the resist layer 212 with greater thickness (e.g. $P_2$) may be implanted at less depth. Further, there may portions of the resist layer 212 with sufficient thickness to prevent the particles 242 from reaching the substrate 202a (e.g. $P_3$). If more than one implanted regions 202a are formed, the implanted regions 202a may be spaced apart by an adjacent region 202b. The adjacent region 202b may be a region that is not implanted with particles.

In the present disclosure, the particles 242 may alter the etch rate of the substrate 202. In the present embodiment, the particles implanted into the substrate 202 may increase the etch rate such that the etch rate of the implanted region 202a may have higher than the etch rate of the adjacent region 202b outside of the implanted region 202a. For example, the particles 242 introduced into the substrate 202 may amorphize the region in which the particles 242 are implanted. Such an amorphous implanted region may have greater etch rate than the adjacent region 202b not implanted with the particles 242. Various particle species may be used to implant into the substrate. Examples of the species may include those containing hydrogen (H), helium (He), boron (B), carbon (N), silicon (Si), nitrogen (N), oxygen (O), fluorine (F), or any other species found in Group 13-18 capable of increasing the etch rate of the substrate 202.

After forming the implanted regions 202a with varying implant depth, the substrate 202 may be etched using one of various etching processes. In the present embodiment, isotropic etching process may be used. This is contrary to the conventional lithography process in which directional or anisotropic etching is required to form the structures with inclined edges. Although the isotropic process may be used, those of ordinary skill in the art will recognize that the present disclosure does not preclude using anisotropic etching process. Specific examples of the anisotropic etchant that may be used include anisotropic KOH exposed to (111) plane of the substrate.

As the implanted region 202a has greater etch rate than the adjacent region 202b, the implanted region 202a may be etched at a higher rate than the non-ion implanted region 202b. In the present embodiment, performing an etching process to the implanted regions 202a with inverse pyramid shape may result in a substrate 202 with an inverse pyramid shaped grooves, as shown in FIG. 2F. Thereafter, the resist layer 212 may be removed from the substrate 202 during the etching process. If desired, the resist 222a may optionally be removed from the substrate prior to etching the substrate 202 using various known resist removal process.

Referring to FIG. 4A-4E, there are shown another exemplary technique for generating a three dimensional (3D) feature on a substrate according to another embodiment of the present disclosure. For clarity and simplicity, several components shown in FIGS. 2A-2F and 3 also included into the present embodiment. As such, technique shown in FIG. 4A-4E should be understood in relation to FIGS. 2A-2F and 3. A detailed description of the same components will not be provided.

Figure 4A:
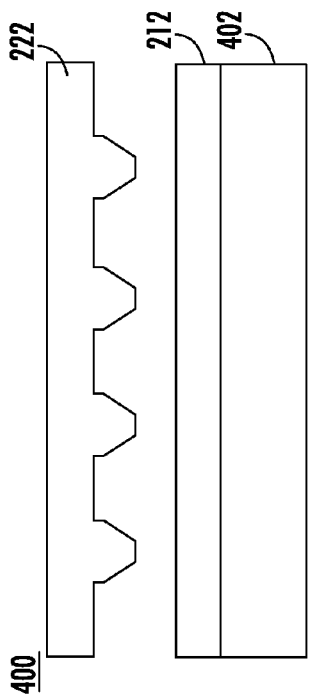
FIG. 4A-4E illustrate another exemplary method for forming a three dimensional (3D) feature on a substrate according to another embodiment of the present disclosure.
Figure 4B:
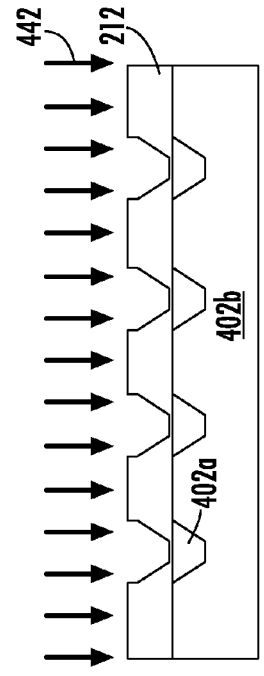
Figure 4C:
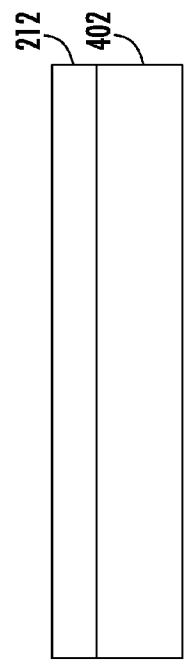
Figure 4D:
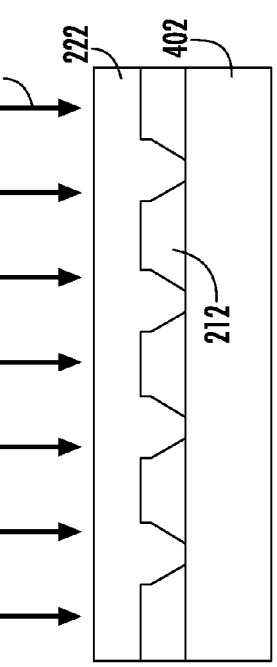
Figure 4E:
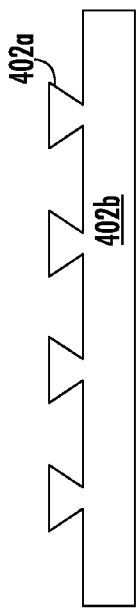

Much like the earlier embodiment, a substrate 402 may be coated with a layer of resist to form the resist 112. Thereafter, the mold 222 having a desired pattern may be pressed against the resist layer 212, as shown in FIGS. 4B and 4C. While the mold 222 is pressed against the resist layer 212, the resist layer 212 cured and hardened optically or thermally.

Thereafter, the mold 422 is removed from the imprinted resist layer 212, and particles 442 of one or more species may be implanted into the substrate through the resist layer 212. As a result, one or more implanted regions 402a may be generated. After the implanted regions 402a are formed, the substrate may be annealed to activate the particles 442. In the present embodiment, the particles 442 implanted into the substrate 402 may be those capable of decreasing the etch rate (or increasing the etch resistance) of the implanted regions 402a. Examples of the species in the particles 442 may include boron (B), carbon (N), silicon (Si), nitrogen (N), or any species found in Group 13-18 of the Periodic Table capable of decreasing the etch rate (or increasing the etch resistance). After the activation, the etch rate of the implanted region 402a may be lower than that of the other portions of the substrate 402.

After the substrate 402 is annealed, the substrate 402 may be etched using one of various etching processes. In the present embodiment, isotropic etching process may be used. However, those of ordinary skill in the art will recognize that the present disclosure does not preclude using anisotropic etching process. As the implanted region 402a has greater etch resistance than the adjacent region 402b, the implanted region 402a may be etched at a lower rate. Meanwhile, the non-ion implanted adjacent region 402b may be etched at a higher rate. As a result, 3D structures with inclined edges may form on the substrate. In the present embodiment, the resist 212 may be removed during the etching process. However, the present disclosure does not preclude removing the resist 212 prior to performing the etching process.

In the present disclosure, the pattern in the resist 212 formed after the curing process may be distorted relative to the shape of the 3D structure on the substrate in order to account for range of the particles and etch rate of the substrate. Slowing down the etch rate may allow for formation of 3D structure having a shape that is much larger than the range of particles to be etched out.

In the present disclosure, several embodiments of the techniques for generating 3D structures are shown. The 3D structures may comprise an inclined edge which is neither perpendicular nor parallel to the general plane of the substrate on which the structures are disposed. The present disclosure, however, does not preclude generating structures with an edge that is either perpendicular or parallel to the general plane. Further, the present disclosure may be just as applicable for generating structure with an edge that is continually curved. Unlike other existing processes, the techniques may be achieved using an ion implantation process where particles are implanted into the substrate through the resist having variable thickness. Moreover, the inclined edge may form using isotropic etching process; although non-isotropic process is not precluded. Although the present disclosure has been described herein in the context of a particular implementation in a particular environment for a particular purpose, those of ordinary skill in the art will recognize that its usefulness is not limited thereto and that the present disclosure may be beneficially implemented in any number of environments for any number of purposes. Indeed, other various embodiments of and modifications to the present disclosure, in addition to those described herein, will be apparent to those of ordinary skill in the art from the foregoing description and accompanying drawings. Thus, such other embodiments and modifications are intended to fall within the scope of the present disclosure.

What is claimed is:

1. A method of forming a three dimensional (3D) feature on a substrate, the method comprising:
   forming a resist structure on the substrate, the resist structure having a first resist portion with a first thickness, a second resist portion with a second thickness, and a third resist portion with a third thickness, wherein the first thickness is less than the second thickness, and wherein the second thickness is less than the third thickness;
   implanting charged particles into the substrate through the first and second resist portions and forming an implanted region in the substrate; and etching the substrate to form the 3D feature on the substrate.

2. The method according to claim 1, wherein the implanted region comprises a first implanted region portion and a second implanted region portion.

3. The method according to claim 2, wherein the second implanted region portion has greater implant depth than the first implanted region portion.

4. The method according to claim 1, further comprising; reducing etch resistance of the implanted region such that the implanted region of the substrate has higher etch rate than a region outside the implanted region.

5. The method according to claim 1, further comprising: annealing the substrate.

6. The method according to claim 1, further comprising:
   increasing etch resistance of the implanted region such than the implanted region of the substrate has higher etch resistance than a region outside the implanted region.

7. The method according to claim 1, wherein the charged particles comprises at least on of hydrogen (H), helium (He), boron (B), carbon (N), silicon (Si), nitrogen (N), oxygen (O), and fluorine (F) species.

8. The method according to claim 1, wherein the 3D feature on the substrate has an edge that is inclined relative to general plane of the substrate.

9. The method according to claim 8, wherein etching the substrate comprises performing an isotropic etching.

10. The method according to claim 1, wherein the forming the resist structure on the substrate comprises:
    coating a resist layer onto the substrate;
    pressing a mold against the resist layer, the mold having at least one protrusion;
    curing the resist layer while the mold is pressed against the resist layer; and
    removing the mold from the substrate.

11. The method according to claim 1, wherein the implanting charged particles comprises implanting the charged particles into the substrate through the first and second resist portions without implanting the charged particles into the substrate through the third resist portion.

12. A method of forming a three dimensional (3D) feature on a substrate, the method comprising:
    forming a resist structure on the substrate, the resist structure having a first resist region and a second resist region, wherein the first resist region has a resist edge that is inclined relative to general plane of the substrate;
    implanting charged particles into the substrate through the first resist region and forming an implanted region in the substrate, the implanted region having an implanted region edge that is inclined relative to the general plane of the substrate; and
    etching the substrate to form the 3D feature on the substrate.

13. The method according to claim 12, wherein the 3D feature has a feature edge that is inclined relative to general plane of the substrate.

14. The method according to claim 12, wherein the implanting charged particles into the substrate comprises implanting the charged particles into the substrate through the first resist region without implanting the charged particles into the substrate through the second resist region.

15. The method according to claim 12, further comprising; reducing etch resistance of the implanted region such that the implanted region of the substrate has higher etch rate than a region outside the implanted region.

16. The method according to claim 12, further comprising increasing etch resistance of the implanted region such that the implanted region of the substrate has lower etch rate than a region outside the implanted region.

17. The method according to claim 12, wherein the charged particles comprises at least on of hydrogen (H), helium (He), boron (B), carbon (N), silicon (Si), nitrogen (N), oxygen (O), and fluorine (F) species.

18. The method according to claim 12, wherein the etching the substrate comprises performing an isotropic etching.

19. The method according to claim 12, wherein the forming the resist structure on the substrate is performed with nano-imprint lithography process.

20. A method of forming a three dimensional (3D) feature on a substrate, the method comprising:
   forming a resist structure on the substrate, the resist structure having a first resist portion with a first thickness, a second resist portion with a second thickness, wherein the first thickness is less than the second thickness;
   implanting charged particles into the substrate through the first resist portion to form an implanted region in the substrate without implanting the charged particles into the substrate through the second resist portion; and
   etching the substrate to remove entirety of the implanted region from the substrate to form the 3D feature on the substrate.

* * * * *